(12) United States Patent
Herman et al.

(10) Patent No.: US 8,557,681 B2
(45) Date of Patent: Oct. 15, 2013

(54) III-NITRIDE WAFER FABRICATION

(75) Inventors: Thomas Herman, Manhattan Beach, CA (US); Robert Beach, Altadena, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 11/978,409

(22) Filed: Oct. 29, 2007

(65) Prior Publication Data

US 2008/0102598 A1  May 1, 2008

Related U.S. Application Data

(60) Provisional application No. 60/863,427, filed on Oct. 30, 2006.

(51) Int. Cl.
*H01L 21/00* (2006.01)
*H01L 21/311* (2006.01)

(52) U.S. Cl.
USPC .......... 438/462; 438/478; 438/584; 438/700; 438/758; 438/767

(58) Field of Classification Search
None
See application file for complete search history.

(56) References Cited

U.S. PATENT DOCUMENTS

| | | | | |
|---|---|---|---|---|
| 3,838,501 A | * | 10/1974 | Umbaugh | 438/113 |
| 6,015,979 A | * | 1/2000 | Sugiura et al. | 257/86 |
| 6,468,347 B1 | * | 10/2002 | Motoki et al. | 117/89 |
| 6,500,747 B1 | * | 12/2002 | Lee et al. | 438/604 |
| 6,737,743 B2 | * | 5/2004 | Urakawa | 257/724 |
| 6,864,160 B2 | * | 3/2005 | Linthicum et al. | 438/479 |
| 6,982,435 B2 | * | 1/2006 | Shibata et al. | 257/76 |
| 7,338,827 B2 | * | 3/2008 | Sugahara et al. | 438/41 |
| 7,410,819 B2 | * | 8/2008 | Takakura et al. | 438/44 |
| 2002/0072196 A1 | * | 6/2002 | Ajmera et al. | 438/424 |
| 2005/0202651 A1 | * | 9/2005 | Akram | 438/463 |
| 2006/0113596 A1 | * | 6/2006 | Cho et al. | 257/347 |
| 2006/0223330 A1 | * | 10/2006 | Fudeta et al. | 438/752 |
| 2006/0246626 A1 | * | 11/2006 | Jiang et al. | 438/114 |
| 2006/0292719 A1 | * | 12/2006 | Lochtefeld et al. | 438/22 |
| 2006/0292833 A1 | * | 12/2006 | Matsushita | 438/462 |
| 2007/0205481 A1 | * | 9/2007 | Ishida | 257/479 |
| 2008/0166852 A1 | * | 7/2008 | Kamikawa | 438/421 |
| 2009/0050927 A1 | * | 2/2009 | Jiang et al. | 257/103 |

FOREIGN PATENT DOCUMENTS

JP   2006165191 A  *  6/2006
WO  WO 2004086579 A1  * 10/2004

OTHER PUBLICATIONS

Alois Krost, Armin Dadgar, GaN-based optoelectronics on silicon substrates, Materials Science and Engineering B, vol. 93, Issues 1-3, May 30, 2002, pp. 77-84, ISSN 0921-5107, DOI: 10.1016/S0921-5107(02)00043-0.*

* cited by examiner

*Primary Examiner* — Evan Pert
*Assistant Examiner* — Andres Munoz
(74) *Attorney, Agent, or Firm* — Farjami & Farjami LLP

(57) ABSTRACT

A method for fabrication of a III-nitride film over a silicon wafer that includes forming control joints to allow for overall stress relief in the III-nitride film during the growth thereof.

19 Claims, 2 Drawing Sheets

III-NITRIDE WAFER FABRICATION

RELATED APPLICATION

This application is based on and claims priority to the U.S. Provisional Application Ser. No. 60/863,427, filed on Oct. 30, 2006, entitled III-Nitride Global Stress Reduction, to which a claim of priority is hereby made and the disclosure of which is incorporated by reference.

DEFINITION

III-nitride as set forth herein refers to an alloy from the InAlGaN system including but not limited to AlN, AlGaN, GaN, InGaN, InN, InAlGaN or the like.

FIELD OF THE INVENTION

The present invention relates to semiconductor device fabrication and particularly to the fabrication of wafers for III-nitride semiconductor devices.

BACKGROUND OF THE INVENTION

Epitaxial growth or deposition of III-nitride films onto substrates of a different material (e.g. silicon) often results in high epitaxial defect density, high film stresses, high wafer warpage, and cracks in the epitaxial films, which are typically caused by the large lattice constant mismatch between the substrate and the III-nitride film, or by the substrate and the III-nitride film having different lattice structure types. For example, when depositing a 2 μm thick AlGaN/GaN/AlN epitaxial layers onto 100 mm diameter silicon substrates, it is not uncommon to have up to 100 μm total warpage, which occurs despite efforts at strain reduction through careful control and selection of transition layers and compositions.

SUMMARY OF THE INVENTION

The wafer warpage, epitaxial film cracks, and defects can occur from the cumulative stress buildup over the surface of a whole wafer.

To reduce warpage and defects, according to the present invention, an array or grid of "control joints" is fabricated onto a surface of a substrate before epitaxial growth of a III-nitride film, such that the epitaxial film is discontinuous across the control joints. As a result, stresses in the III-nitride film are only able to accumulate inside the boundaries defined by the control joints and cannot propagate past the control joints. The control joints also may force an intentional "crack" in the III-nitride film, localized near the control joint, which can lower the total stress buildup across the wafer, resulting in lower overall wafer warpage.

A control joint according to the present invention can take several forms. According to one embodiment a control joint can be a shallow trench etched into one surface of the substrate. A typical trench can be 100 angstrom deep and several micrometer wide. The shallow trenches can be arranged in a rectangular vertical and horizontal array (i.e. a grid) with center-to-center spacings in the range 10-25 mm.

According to another aspect of the present invention the shallow trenches can reside inside of the normal saw streets between die and thus do not occupy any additional space on the wafer.

According to another aspect of the present invention, if a more planar substrate surface is desired, the shallow trenches could be filled with a dielectric (e.g. oxide) or amorphous silicon or other filling material.

Note that the control joints need not be continuous, and can be joints of closely spaced segments.

Other features and advantages of the present invention will become apparent from the following description of the invention which refers to the accompanying drawings.

DETAILED DESCRIPTION OF THE EMBODIMENTS

Figure 1:
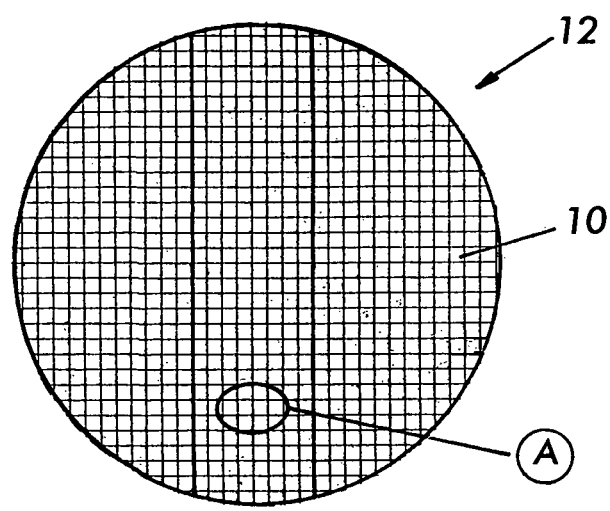
FIG. 1 shows a top plan view of a wafer that includes stress reduction trenches formed in one surface thereof to constitute a control joint according to an embodiment of the present invention.
Figure 2:
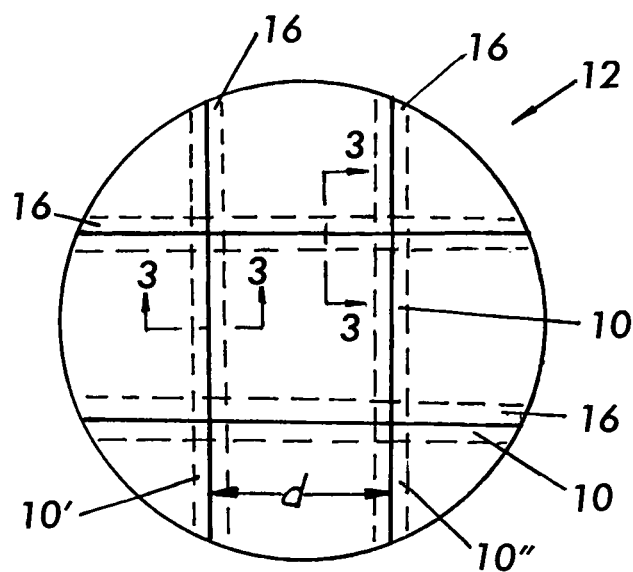
FIG. 2 illustrates portion A (circled in FIG. 1) of the wafer of FIG. 1.
Figure 3:
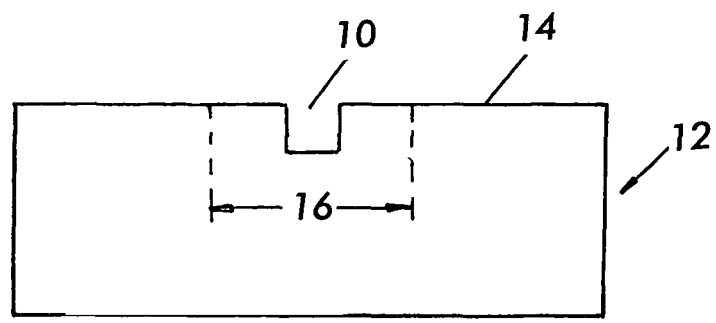
FIG. 3 illustrates a cross-sectional view of the wafer along lines 3-3 (FIG. 1) viewed in the direction of the arrows.

Referring to FIGS. 1, 2, and 3, in a method according to one embodiment of the present invention shallow trenches 10 are etched into one surface of a silicon wafer 12. Preferably, trenches 10 cross one another to form a grid, as specifically illustrated by FIGS. 1 and 2. Trenches 10 function to reduce the overall stress in the III-nitride epitaxial layer that is to be formed over surface 14 of wafer 12. Each trench 10 may be about 100 angstroms deep, and several microns wide. Furthermore, the center-to-center spacing d of opposing trenches (e.g. trenches 10' and 10") may be in the range of 10-25 mm.

According to one aspect of the present invention trenches 10 are formed inside regions 16 of wafer 12 designated as saw street for the dicing of the wafer into individual die.

Figure 4:
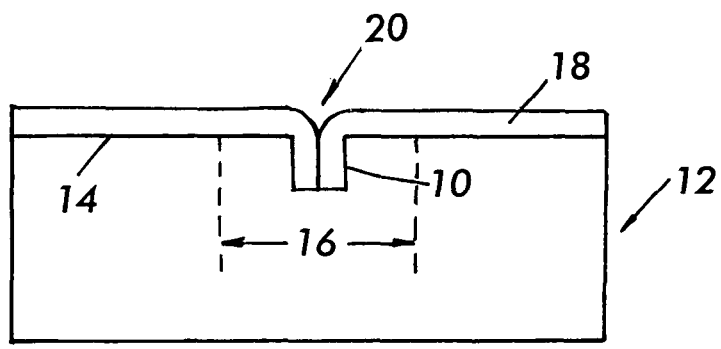
FIG. 4 illustrates a portion of a wafer that includes stress reduction trenches after growth of a III-nitride body thereon.

Referring now to FIG. 4, according to the present invention, a III-nitride body 18 (e.g. AlN) is epitaxially formed over surface 14 of wafer 12 and filling trenches 10. Note that film 18 is rendered discontinuous over trenches 10. As a result, a crack 20 may be formed in III-nitride body 18 over trench 10, relieving a portion of the stress developed in III-nitride body 18.

Thereafter, any III-nitride device can be formed over III-nitride bodies 18 between trenches 10 followed by a sawing step inside regions 16 (streets) to obtain III-nitride devices.

Figure 5:
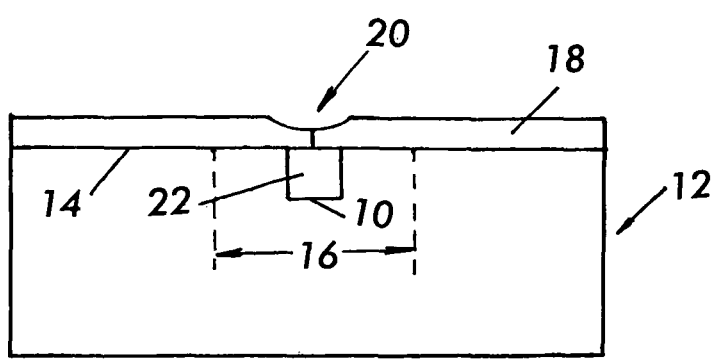
FIG. 5 illustrates a portion of a wafer that includes stress relief trenches filled with a filler body according to an alternative embodiment of the present invention.

Referring now to FIG. 5, in an alternative embodiment, a filler material having the capability of preventing nucleation of III-nitride 18, is deposited over surface 14 of wafer 12 filling trenches 10. Thereafter, in a planarization step, excess filler body is removed from surface 14 leaving only filler 22 inside trenches 10 substantially coplanar with the top of surface 14. Thereafter, a nitride body 18 is epitaxially grown over surface 14. Note that the filler renders III-nitride body 18 discontinuous over trenches 10, which may result in a stress relief crack 20 therein. Suitable materials for fillers 22 include dielectrics such as $SiO_2$, or amorphous silicon.

Thereafter, any III-nitride device can be formed over III-nitride bodies 18 between trenches 10 followed by a sawing step inside regions 16 (streets) to obtain III-nitride devices.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a semiconductor wafer, comprising:

forming stress reduction trenches in a surface of a silicon substrate, said stress reduction trenches residing in regions designated to serve as dicing streets, said stress reduction trenches greater than one hundred times wider than deep, said dicing streets wider than said stress reduction trenches;

growing a III-nitride body over said surface of said silicon substrate, said III-nitride body filling said stress reduction trenches, wherein said III-nitride body extends continuously over a boundary between said surface and at least one of said stress reduction trenches, and wherein a stress relief crack is formed in said III-nitride body over at least one of said stress reduction trenches; and dicing said semiconductor wafer into individual devices by cutting said semiconductor wafer along said dicing streets.

2. The method of claim 1, wherein said stress reduction trenches cross one another.

3. The method of claim 1, wherein said stress reduction trenches are between 10-25 mm apart.

4. The method of claim 1, wherein said stress reduction trenches are about 100 angstroms deep.

5. The method of claim 1, wherein said stress reduction trenches are more than 1 micron wide.

6. The method of claim 1, wherein said stress reduction trenches form a grid.

7. The method of claim 1, wherein said III-nitride body comprises AlN.

8. The method of claim 1, wherein said III-nitride body is discontinuous over said stress reduction trenches.

9. A method of fabricating a semiconductor wafer, comprising:

forming stress reduction trenches in a surface of a silicon substrate, said stress reduction trenches residing in regions designated to serve as dicing streets, said stress reduction trenches greater than one hundred times wider than deep, said dicing streets wider than said stress reduction trenches;

growing a III-nitride body over said surface of said silicon substrate, wherein said III-nitride body extends continuously over a boundary between said surface and at least one of said stress reduction trenches;

filling said stress reduction trenches with said III-nitride body to form stress relief cracks in said III-nitride body over said stress reduction trenches; and dicing said semiconductor wafer into individual devices by cutting said semiconductor wafer along said dicing streets.

10. The method of claim 9, wherein said stress reduction trenches are about 100 angstroms deep.

11. The method of claim 9, wherein said stress reduction trenches are between 10-25 mm apart.

12. The method of claim 6, wherein said stress reduction trenches form a grid.

13. The method of claim 6, wherein said III-nitride body comprises AlN.

14. A method of fabricating a semiconductor wafer, comprising:

forming stress reduction trenches in a surface of a silicon substrate, said stress reduction trenches residing in regions designated to serve as dicing streets, said stress reduction trenches greater than one hundred times wider than deep, said dicing streets wider than said stress reduction trenches;

growing a III-nitride body over said surface of said silicon substrate, said III-nitride body filling said stress reduction trenches, wherein said III-nitride body extends continuously over a boundary between said surface and at least one of said stress reduction trenches, and wherein a stress relief crack is formed in said III-nitride body over at least one of said stress reduction trenches;

forming a plurality of III-nitride devices over said III-nitride body; and dicing said semiconductor wafer into individual III-nitride devices by cutting said semiconductor wafer along said dicing streets.

15. The method of claim 14, wherein said stress reduction trenches are about 100 angstroms deep.

16. The method of claim 14, wherein said stress reduction trenches are between 10-25 mm apart.

17. The method of claim 14, wherein said stress reduction trenches form a grid.

18. The method of claim 14, wherein said III-nitride body comprises AlN.

19. The method of claim 14, wherein said III-nitride body is discontinuous over said stress reduction trenches.

* * * * *